United States Patent [19]
Gustafson

[11] Patent Number: 5,771,568
[45] Date of Patent: Jun. 30, 1998

[54] METHOD FOR MANUFACTURING A HEAD SUSPENSION HAVING ELECTRICAL TRACE INTERCONNECTS WITH REDUCED CAPACITANCE

[75] Inventor: Gary Gustafson, Darwin, Minn.

[73] Assignee: Hutchinson Technology Incorporated, Hutchinson, Minn.

[21] Appl. No.: 723,787

[22] Filed: Sep. 30, 1996

Related U.S. Application Data

[62] Division of Ser. No. 397,491, Mar. 2, 1995, abandoned.
[51] Int. Cl.[6] ..................................................... G11B 5/42
[52] U.S. Cl. .................... 29/603.03; 29/603.06; 360/104
[58] Field of Search ........................... 29/603.01, 603.04, 29/603.05, 603.06; 360/103–106

[56] References Cited

U.S. PATENT DOCUMENTS

| | | | |
|---|---|---|---|
| 5,126,904 | 6/1992 | Sakurai | 360/104 |
| 5,305,168 | 4/1994 | Lin et al. | 360/104 |
| 5,446,611 | 8/1995 | Webber | 360/104 |
| 5,491,597 | 2/1996 | Bennin et al. | 360/104 |

*Primary Examiner*—Carl E. Hall
*Attorney, Agent, or Firm*—Faegre & Benson LLP

[57] ABSTRACT

A head suspension assembly, for use in a magnetic rigid disk storage device, has an electrical conductor adherently secured along the length of the suspension and insulated from the surface of the load beam by means of a layer of dielectric insulating material. The suspension assembly is fabricated with capacitive coupling reducing areas or apertures to reduce the capacitive coupling between the electrical conductors and the metal surface of the head suspension.

9 Claims, 4 Drawing Sheets

5,771,568

METHOD FOR MANUFACTURING A HEAD SUSPENSION HAVING ELECTRICAL TRACE INTERCONNECTS WITH REDUCED CAPACITANCE

This is a division of U.S. patent application Ser. No. 08/397,491, filed Mar. 2, 1995, and entitled "Reduced Capacitance of Electrical Conductor on Head Suspension Assembly," now abandoned in favor of continuing U.S. patent application Ser. No. 08/804,889 filed Feb. 24, 1997.

FIELD OF THE INVENTION

This invention relates to an improved head suspension assembly for use in a magnetic rigid disk storage device. Specifically the invention relates to improvements in the conduction of electrical signals from a floating read/write transducer head to external signal utilization means. This improved head suspension assembly incorporates electrical conductors for electrical transmission from a floating read/write transducer head to an external signal utilization means. Those conductors typically have only a minimal amount of dielectric material between them and the surface of the load beam to provide insulation between the conductors and the suspension. The improvement is that the head suspension assembly is fabricated with aperture areas located in proximity with the conductor path along the load beam in order to controllably reduce capacitive coupling between the electrical conductor and the metal surface of the head suspension assembly through the insulative layer of dielectric material to a low or predetermined optimal magnitude. The reduction in the coupling capacitance between the conductor and the surface of the load beam also inherently reduces the capacitive coupling between the conductors as well as the capacitive coupling to the load beam.

BACKGROUND OF THE INVENTION

In a magnetic rigid disk information storage device, information is stored in small magnetized domains located on rigid disk surfaces, thus allowing large quantities of information to be conveniently manipulated in a small physical volume.

A rigid disk storage device typically includes a frame with a spindle motor mounted to the frame for rotating the disks, which are arranged in a disk stack. Magnetic information domains are created on a disk by a magnetic read/write transducer head flying in close proximity to each disk. A transducer head is supported and oriented to each disk by a head suspension assembly (HSA).

An HSA includes an elongated load beam region with proximal and distal ends, an actuator arm mounting region at the proximal end of the load beam region for mounting the HSA to an actuator arm of the disk drive, and a gimballing flexure region at the distal end of the load beam. A transducer head is mounted to the gimballing flexure region of the HSA in read/write orientation to an associated disk to allow the transducer head to pitch about a first axis, generally oriented transversely with respect to the HSA, and roll about a second or longitudinal axis, perpendicular to the first axis. This pitching and rolling occurs when imperfections in the disk drive assembly or the disk surface tend to place the head in improper positions relative to the disk surface. In order permit this pitching and rolling while maintaining proper desired parallel coplanar relationship between the HSA and its associated disk, the HSA has a combination of rigid and flexible areas.

In some HSA styles, the load beam region, actuator arm mounting region and gimballing flexure region are each separate elements and are attached to each other. In other HSA styles, two or more of these regions may be manufactured together as a single structure.

The HSA and its transducer head (oriented in a stacked array corresponding to the disk stack) are powered and positioned with respect to the disk by an actuator mounted to the frame. Signal conducting means, such as electrical or optical conductors, are connected to the transducer head for conducting signals along the load beam to the actuator arm mounting region and then transmission to remote signal amplification and utilization circuitry.

A number of different types of electrical conductors are in use for conducting electrical signals along the HSA. To contribute to the overall optimum functioning of the HSAs in the disk drive, an electrical conductor must comply with exacting specifications. The electrical conductor must not adversely interfere with the flexibility of the spring areas of the HSA in maintaining precise parallel coplanar alignment of the transducer head to the disk surface. The ideal electrical conductor should be low in mass, very thin, elastically flexible and efficient to manufacture and assemble to the HSA. As the computer field proceeds to move toward overall smaller size requirements, efforts continue to provide electrical conductors matching such ideal requirements.

There are a number of electrical conductors presently available, each having their own particular characteristics. Conventional HSA electrical conductors are small insulated copper wires (44 AWG and larger) routed through electrically insulating PTFE tubing (0.25 mm–0.38 mm). In assembly, the encasing PTFE tubing generally runs the length of the HSA surface, from the distal transducer head end to the proximal end. To provide electrical connection to the transducer head, it is necessary to run a small loop of wires from a distal end of the PTFE tube for attachment to the head terminals.

Recently, some manufacturers of HSAs, including the assignee of the present application, Hutchinson Technology Inc., have proposed the use of laminated, composite or clad materials to pattern and process an electrical conductor directly onto a planar surface of the HSA. In such patterned HSA designs, there may be an increase in electrostatic coupling between the electrical conductor and the HSA, which is generally fabricated of stainless steel because of the close proximity of the conductor to the HSA. The present invention provides a structurally modified HSA to substantially reduce the capacitance value when the electrical conductor is directly patterned and processed onto a dielectric layer on the HSA surface. Since capacitance is a function of surface area, reduction of the surface area of the HSA exposed to the conductive traces reduces the capacitance or allows it to be reduced to an optimal magnitude.

Applicant's assignee has currently pending several applications relating to the use of electrical trace interconnects including Ser. No. 08/227,978 filed Apr. 15, 1994, Ser. No. 08/227,960 filed Apr. 15, 1994 and Ser. No. 08/249,117 filed May 25, 1994. Those applications discuss various methods for providing conductive traces for interconnection of the signals from the magnetic head which are incorporated herein by reference. Application Ser. No. 08/227,978 discloses a different technique for the reduction of coupling capacitance between the load beam and the conductors by increasing the spacing distance between the conductive traces and the surface of the load beam by providing standoffs along the length of the conductors.

BRIEF DESCRIPTION OF THE INVENTION

The present invention relates to a magnetic head suspension assembly having a transducer head incorporated in a slider for movement to selected locations across the surface of a rotating media. Conductive traces or electrical conductors are connected to the transducer for conducting signals therefrom along the load beam of the HSA for transmission to remote signal utilization means. The load beam structure has certain improvements for reducing or optimizing the magnitude of the capacitive coupling between the conductive traces and the load beam. The improvements in the load beam structure are comprised as follows.

At least one conductive trace or electrical conductor is configured for connection at a first end of the load beam to the transducer and in the vicinity of a second opposing end of the load beam the conductive trace or electrical conductor is configured for connection to remote signal utilization means. The trace is insulated from the load beam by a layer of dielectric material between the trace and the surface of the load beam. The layer of dielectric material and the trace are structurally supported by the surface of the load beam. At least one capacitance reducing aperture penetrates through the surface of the load beam at one or more locations along the path of the conductive traces. The conductive traces are thus in adjoining relationship to the surface of the load beam only to the extent necessary to provide support for the traces while maintaining necessary mechanical strength characteristics of the load beam. Thus, the capacitance coupling between the traces and the load beam is reduced by reducing the area of the load beam adjacent to the traces. Of course if the operating characteristics of the affected circuits require an optimal reduced capacitance, the size and or numbers of capacitance reducing apertures can be tuned to obtain an optimal magnitude for the coupling capacitance.

DETAILED DESCRIPTION OF THE INVENTION

In the HSA 8 according to the present invention, illustrated in FIGS. 1–4, an electrical insulation layer 12 is used between the conductor or signal line 14 and the load beam 10 in assembling the novel laminated, composite or clad HSA 8 structure. The load beam 10 is preferably made of sheet stainless steel. The electrical insulation layer 12 is preferably a polyimide insulator layer applied in any of the ways discussed in the prior applications of Applicant's assignee cited in the background section hereof. The conductors 14 may preferably be either copper or a beryllium copper alloy such as BeCu 172 or other similar suitable materials.

Figure 1:
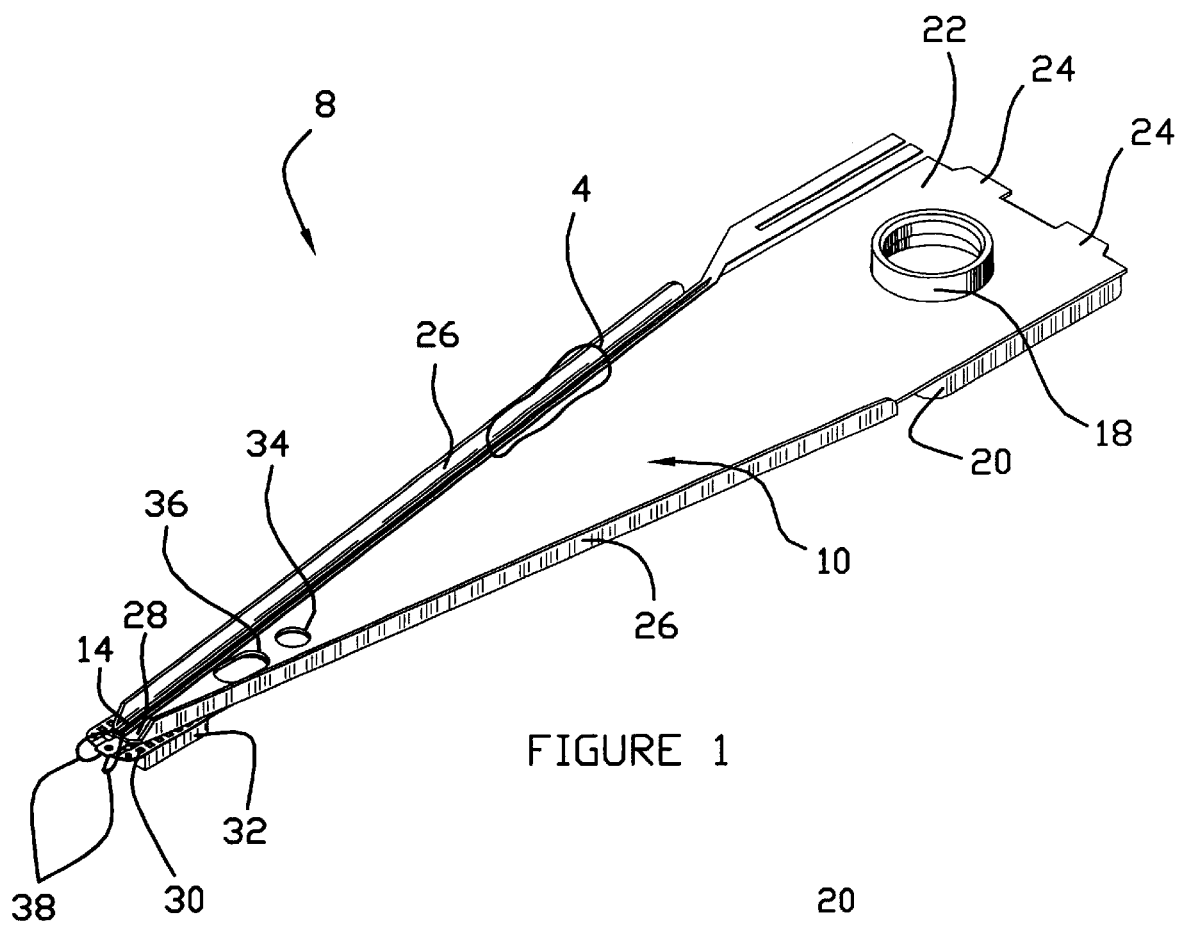
FIG. 1 is an isometric view of a head suspension assembly according to the present invention, illustrating a conductive trace mounted to the load beam.
Figure 2:
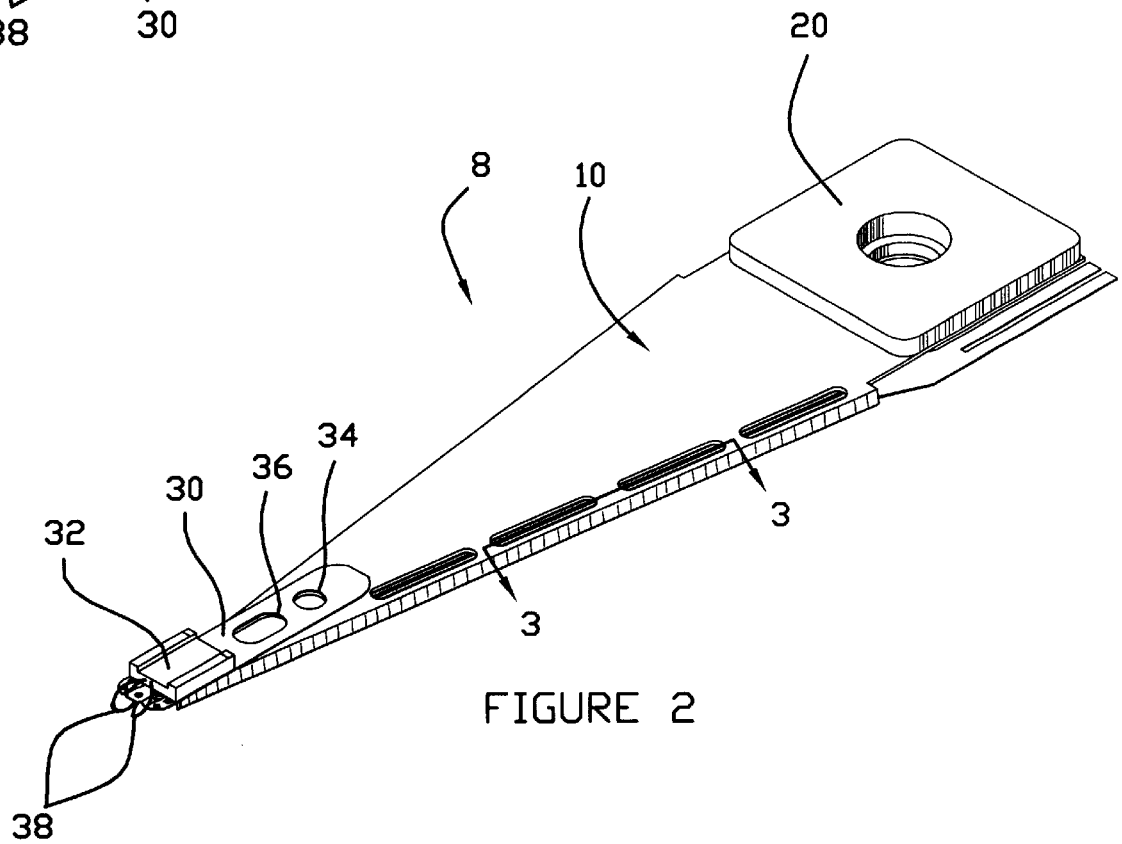
FIG. 2 is an isometric view of the reverse side of the head suspension assembly of FIG. 1, showing discontinuities in the load beam surface spaced beneath the conductive trace.
Figure 3:
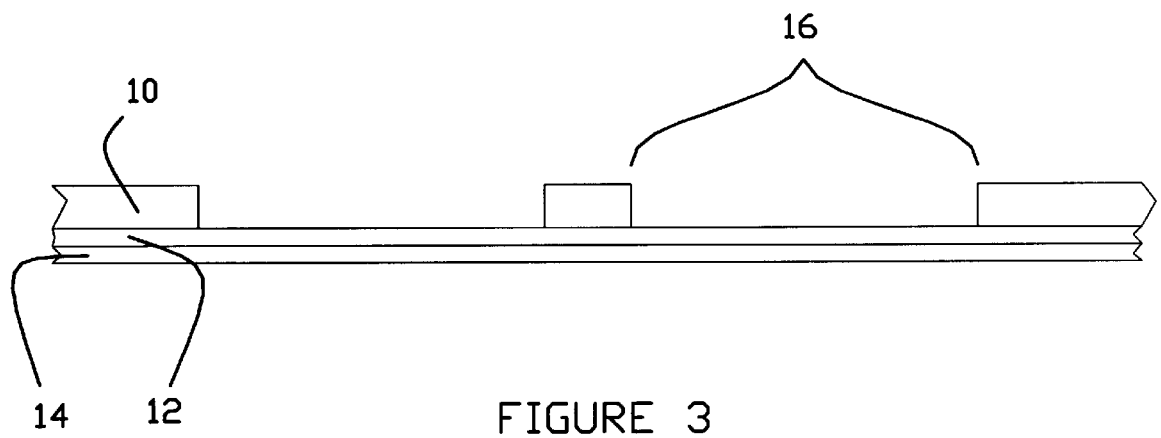
FIG. 3 is a profile view taken along line 3—3 in FIG. 2 illustrating the laminate layers comprising the load beam of FIGS. 1 and 2.
Figure 4:
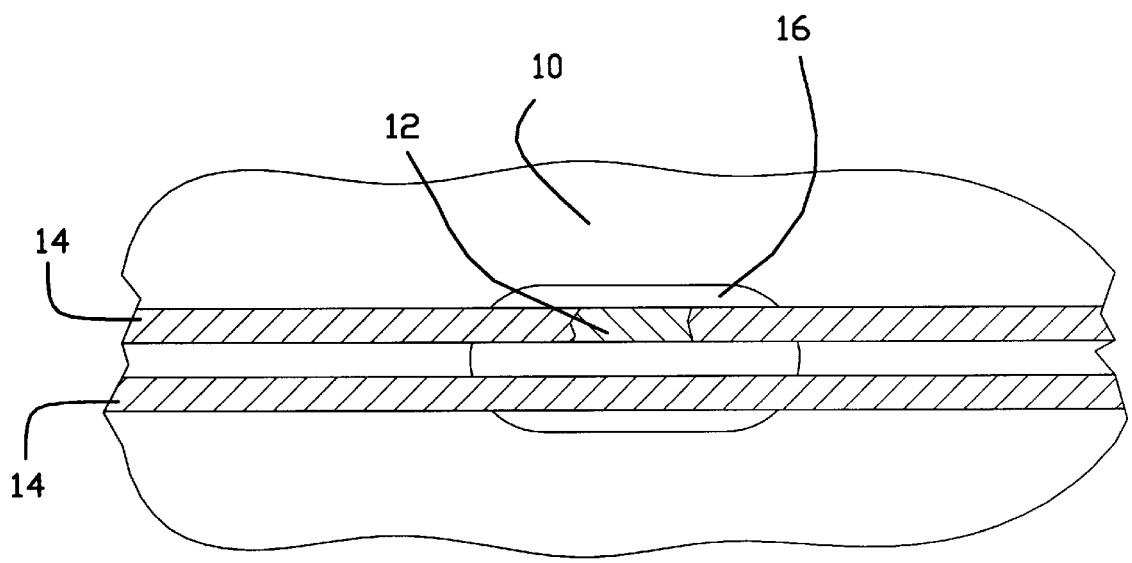
FIG. 4 is an enlarged view of the conductive trace mounted to the load beam of FIG. 1 with load beam discontinuities shown in dotted line.

Also shown in the HSA 8 of FIGS. 1 and 2, the swaging boss 18 projects upwardly from the base plate 20 positioned against the lower planar surface of the load beam 10. The proximal end 22 of the load beam 10 is provided with proximally extending tabs 24 which serve as tooling features to facilitate accurate angular placement in aligning of the HSA 8. Stiffening flanges 26 are formed to project upwardly along perimeter edges of the load beam 10 to add rigidity in an area from the distal end 28 of the load beam 10 to just prior to the base plate 20. Also positioned at the distal end 28 of the load beam 10 is the flexure 30 to provide gimballing support for the read/write transducer head 32. The tooling hole 34 and the tooling slot 36 in the flexure 30 cooperate with a corresponding hole 34 and slot 36 on the load beam 10 in aligning and connecting the flexure 30 to the load beam 10. Wires 38 provide operable connection between the distal end of the electrical conductors 14 and the read/write transducer head 32.

The capacitive coupling between the conductor 14 and the surface of the load beam 10 can limit the data rate or signal speed over the conductor 14. The coupling can also act additively to form capacitive coupling paths between conductors which are capacitively coupled to each other through the capacitive path to the load beam. The electrical insulating layer 12 bonding the conductors 14 to the load beam 10 surface acts as a dielectric between adjacent conductors 14 and between each conductor 14 and the load beam 10 surface. This arrangement of two electrically conducting members separated by a dielectric forms a capacitor. When the frequency of the signals carried on conductor 14 becomes high enough, the impedance between conductor 14 and the load beam 10 surface may sufficiently reduced so that the effective signal from the conductor 14 may be heavily degraded or even lost. In other applications it may be that a particular optimal value of the reduced capacitance is appropriate in order to tune the electrical characteristics of the electrical conductor 14.

The discovery of the present invention is that etching or otherwise removing portions of the stainless steel load beam 10 material from beneath the path of the conductor 14 along load beam 10 reduces the surface area of one of the plates of the capacitor comprised of the load beam 10 and conductor 14 and thus reduces the attendant coupling capacitance to either a minimum level or a selected optimal reduced value. As visible in FIGS. 2–4, the load beam 10 is formed with apertures, openings or discontinuities 16 in its surface. The concept of the present invention helps minimize or optimize the capacitance of signal conductors routed across the surface of the load beam and thereby improves HSA designs using laminated, composite or clad materials.

The providing of apertures in the surface of the load beam 10 under the path of conductor 14 does not appreciably reduce the strength of the load beam and is not expected to materially alter the dynamic mechanical frequency and resonance response characteristics of the overall suspension although the provision of capacitance reduction apertures also reduces the mass of the suspension slightly, a change that is usually considered to be beneficial.

Figure 5:
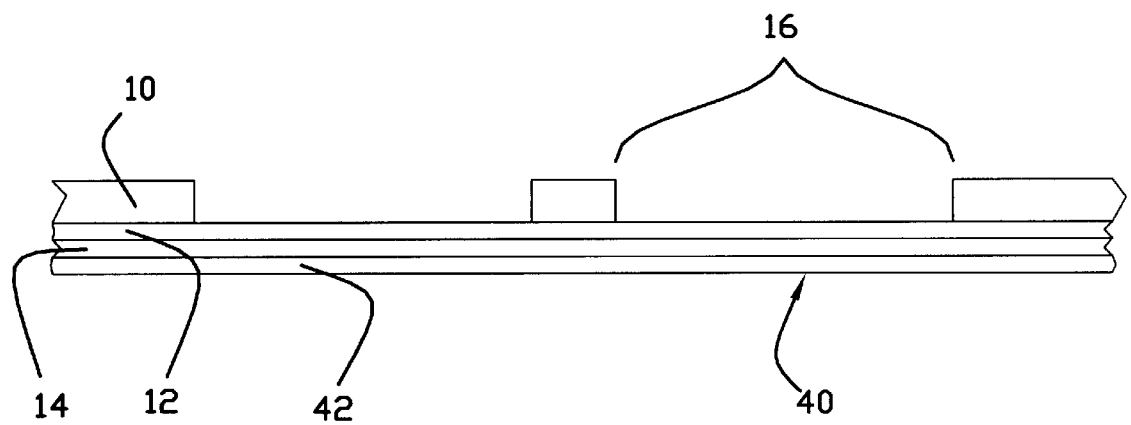
FIG. 5 is a profile view of a different embodiment of the invention taken along line 3—3 in FIG. 2 where an additional insulating layer 42 is applied.
Figure 6:
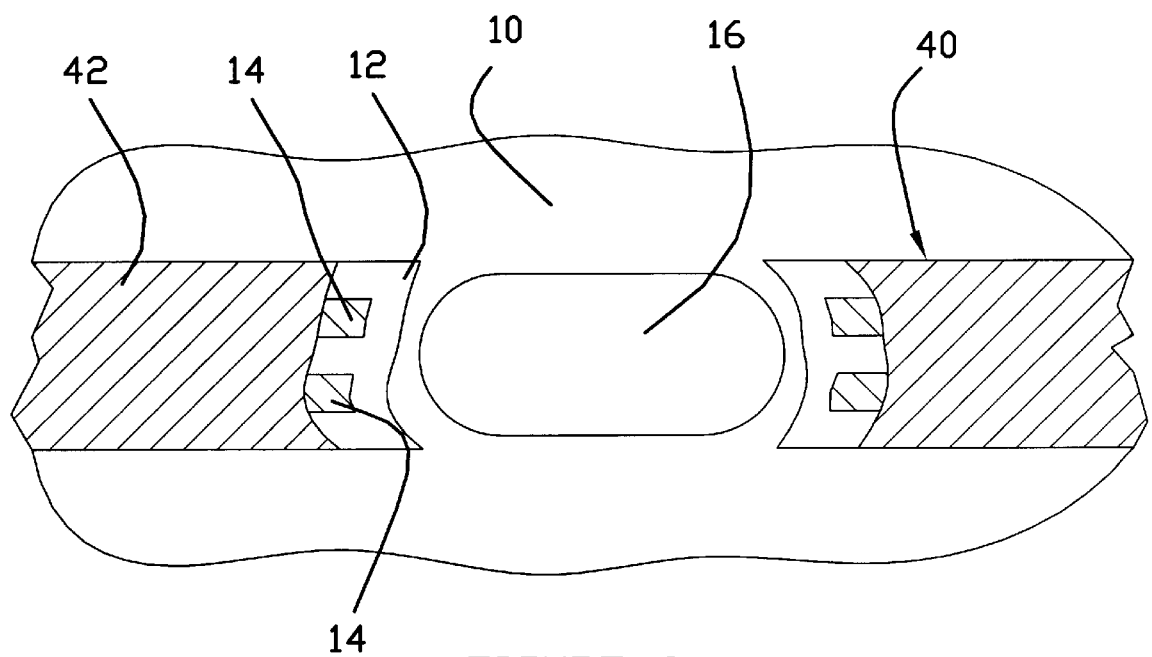
FIG. 6 is an enlarged view of the embodiment of the conductive trace illustrated in FIG. 5, the insulating layer 12, the conductors 14 and the protective layer 42 being partially cut away to show the arrangement of the layers and expose aperture 16.

In FIGS. 5 and 6 an alternative embodiment of the present invention is also shown. The conductive traces 14 in this embodiment are covered by a further layer of insulative material 42 to insulate the conductors from contact with other disk drive components or each other. The addition of the protective layer does not affect the capacitance reduction effects of using the capacitance reducing apertures of the present invention.

Figure 7:
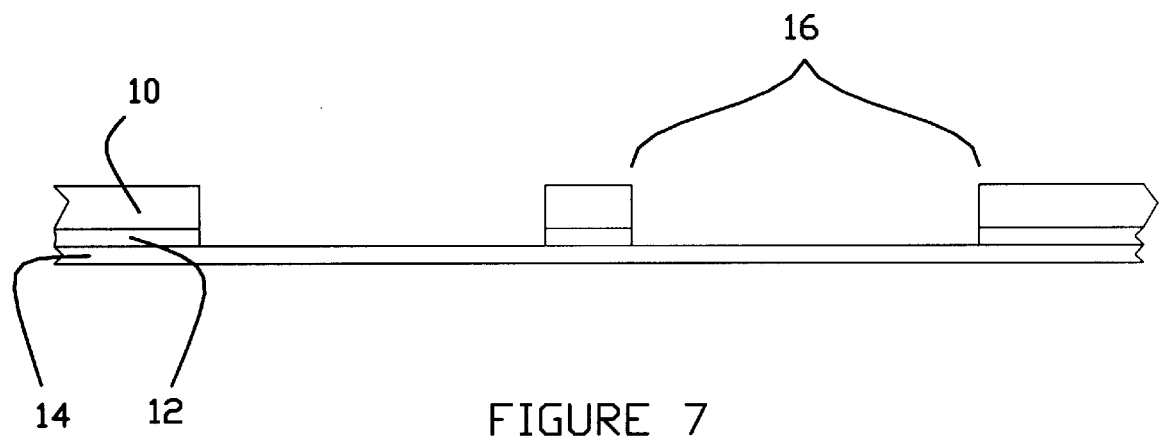
FIG. 7 is a profile view of a further embodiment of the invention taken along line 3—3 in FIG. 2.
Figure 8:
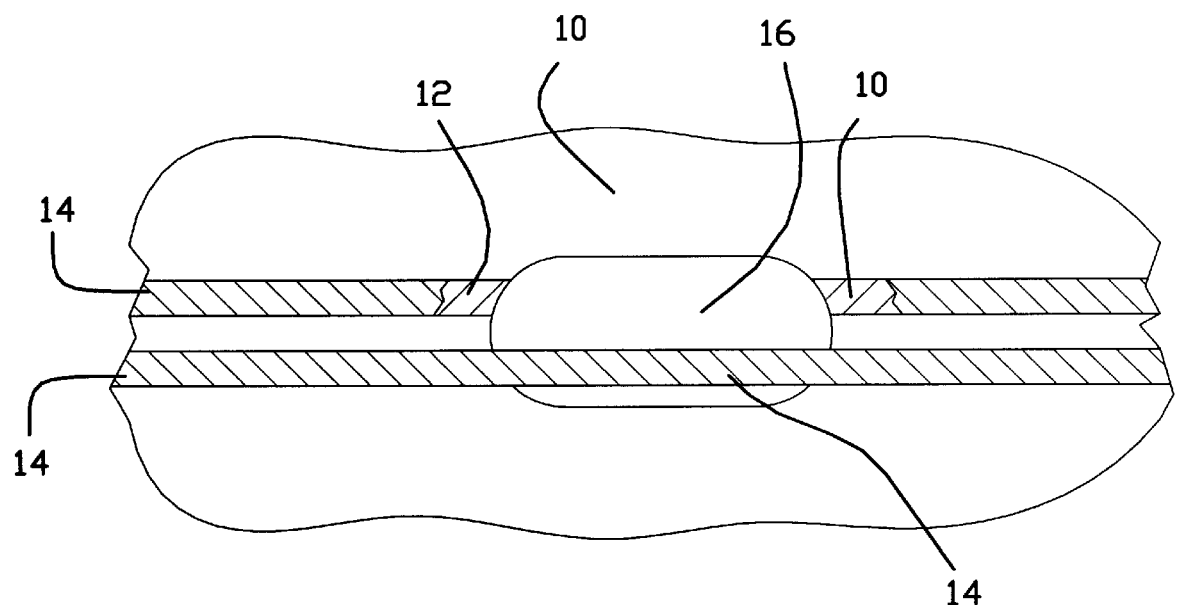
FIG. 8 is an enlarged view of the embodiment of the conductive trace illustrated in FIG. 7, the insulating layer 12 and conductor 14 of one of the pairs of conductors being cut away in the vicinity of the capacitance reducing aperture to show the arrangement of the layers and expose aperture 16.

In FIGS. 7 and 8 a further embodiment of the present invention is shown. In this embodiment of the invention, the insulation layer 12 that is used to provide electrical insulation between the conductors and the surface of the load beam is not applied to the conductors in the region of the apertures 16. In this embodiment there is some reduction in the weight of the suspension by reducing the amount of insulating material over the embodiment shown in FIGS. 3 and 4.

What is claimed is:

1. In a method for assembling a magnetic head suspension assembly having a transducer head incorporated in a slider for accessing selected locations across a rotating media to read and write data thereon, said assembling method comprising:

providing a conductive trace interconnect assembly having a pre-shaped, single-layer, self-supporting, plastic-deformation resistant, thin, elongated, substrate-free conductive trace having flexible and rigid regions corresponding respectively to flexible and rigid regions in a load beam of said magnetic head suspension assembly, configuring each conductive trace to conform to surface spatial topography of the load beam, and applying to pre-determined portions of each conductive trace a minimum electrically insulating amount of dielectric material; and connecting said conductive trace interconnect assembly to the transducer head for conducting signals therefrom along a load beam of the magnetic head suspension assembly for transmission to remote signal utilization means;

an improvement to said assembling method, said improvement comprising:

providing the load beam with a plurality of capacitive coupling reducing holes extending completely through a thickness of said load beam along a pathway between a first perimeter edge and a second perimeter edge of said load beam;

attaching said conductive trace interconnect to said load beam at selected locations along said pathway and above said plurality of capacitive coupling reducing holes so as to minimize capacitance coupling between the conductive trace interconnect assembly and the load beam by reducing the area of the load beam subject to a capacitive coupling relationship to the conductive trace interconnect assembly.

2. In a method for assembling a magnetic head suspension assembly for supporting a transducer head incorporated in a slider in read/write orientation to an associated rotating magnetic media, said assembling method comprising, in combination:

providing a load beam having a proximal end and a distal end, and having a flexure means at the distal end of the load beam for attachment of the transducer head;

routing electrically conductive elements from the proximal end to the distal end, so that the electrically conductive elements are operably connected at the distal end to the transducer head for conducting electrical signals from the transducer head along the load beam to the proximal end for transmission to remote signal utilization means;

providing the conductive elements with a minimum electrically insulating layer of dielectric material between the electrically conductive elements and the load beam;

an improvement to said assembling method, said improvement comprising:

providing a plurality of capacitance reducing holes extending completely through a thickness of the load beam the holes being positioned between a first perimeter edge of the load beam and a second perimeter edge of the load beam below the electrically conductive elements to reduce capacitive coupling surface area of the load beam at a plurality of locations along a route of the conductive elements.

3. A method for manufacturing a head suspension having at least one integrated conductive lead, comprising the steps of:

providing a load beam having a rigid region;

providing at least one integrated lead along a predetermined pathway of the rigid region of the load beam; and forming a plurality of capacitive coupling reducing holes extending completely through a thickness of the load beam and along at least a portion of a predetermined pathway of the rigid region of the load beam and between a first perimeter edge and a second perimeter edge of the load beam, wherein the plurality of capacitive coupling reducing holes minimize the capacitance coupling between the integrated conductive lead and the load beam by reducing the area of the load beam subject to a capacitive coupling relationship to the integrated conductive lead.

4. The method for assembling a head suspension of claim 3, wherein the forming step comprises etching the plurality of capacitive coupling reducing holes.

5. The method of manufacturing a head suspension of claim 3, wherein the step of providing at least one integrated lead includes mounting the integrated lead along the predetermined pathway of the rigid region of the load beam.

6. The method for manufacturing a head suspension of claim 3, wherein the forming step includes forming a plurality of capacitive coupling reducing holes along at least about one-half of the length of the predetermined pathway.

7. The method for manufacturing a head suspension of claim 3, wherein the forming step includes forming a plurality of capacitive coupling reducing holes along at least about three-fourths of the length of the predetermined pathway.

8. The method for manufacturing a head suspension of claim 3, wherein the forming step includes forming a plurality of capacitive coupling reducing holes along the entire length of the predetermined pathway.

9. The method of assembling a head suspension of claim 3, wherein the step of providing a load beam further includes providing stiffening rails that extend along the first and second perimeter edges of the load beam at the rigid region, the plurality of capacitive coupling reducing holes being formed between the stiffening rails.

* * * * *